United States Patent
Yu et al.

(10) Patent No.: US 12,026,444 B2
(45) Date of Patent: Jul. 2, 2024

(54) DYNAMIC PORT HANDLING FOR ISOLATED MODULES AND DYNAMIC FUNCTION EXCHANGE

(71) Applicant: Xilinx, Inc., San Jose, CA (US)

(72) Inventors: Hao Yu, Broomfield, CO (US); Jun Liu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 192 days.

(21) Appl. No.: 17/522,834

(22) Filed: Nov. 9, 2021

(65) Prior Publication Data

US 2023/0148419 A1    May 11, 2023

(51) Int. Cl.
*G06F 30/343* (2020.01)
*G06F 30/327* (2020.01)
*G06F 30/347* (2020.01)

(52) U.S. Cl.
CPC .......... *G06F 30/343* (2020.01); *G06F 30/327* (2020.01); *G06F 30/347* (2020.01)

(58) Field of Classification Search
CPC ...... G06F 30/327; G06F 30/34; G06F 30/343; G06F 30/347; G06F 30/392; G06F 30/394
See application file for complete search history.

(56) References Cited

U.S. PATENT DOCUMENTS

| | | | |
|---|---|---|---|
| 6,091,263 A | 7/2000 | New et al. | |
| 6,150,839 A | 11/2000 | New | |
| 6,204,687 B1 | 3/2001 | Schultz et al. | |
| 6,462,579 B1 | 10/2002 | Camilleri et al. | |
| 6,507,211 B1 | 1/2003 | Schultz et al. | |
| 6,525,562 B1 | 2/2003 | Schultz et al. | |
| 6,526,557 B1 | 2/2003 | Young et al. | |
| 6,573,748 B1 | 6/2003 | Trimberger | |
| 6,625,794 B1 | 9/2003 | Trimberger | |
| 6,759,869 B1 | 7/2004 | Young et al. | |
| 6,810,514 B1 | 10/2004 | Alfke et al. | |
| 6,836,842 B1 | 12/2004 | Guccione et al. | |

(Continued)

FOREIGN PATENT DOCUMENTS

JP    H09245067 A  *  9/1997

OTHER PUBLICATIONS

"SDAccel Environment User Guide," UG1023 (v2018.3), Xilinx, Inc., Jan. 24, 2019, p. 165.

*Primary Examiner* — Jack Chiang
*Assistant Examiner* — Aric Lin
(74) *Attorney, Agent, or Firm* — Kevin T. Cuenot

(57) ABSTRACT

Dynamic port handling for circuit designs can include inserting, within a static isolated module of a circuit design, static drivers configured to drive isolated modules of reconfigurable module (RM) instances for inclusion in an RM of the circuit design. For each RM instance of a plurality of RM instances to be inserted into the RM, one or more additional ports can be inserted in the RM based on a number of isolated modules included in a current RM instance. Further, net(s) corresponding to the additional port(s) can be created. The circuit design, including the current RM instance, the additional port(s), and the net(s), can be placed and routed. Prior to the inserting and the performing place and route for a next RM instance to be inserted into the RM, the current RM instance can be removed from the RM along with the additional port(s) and the net(s).

18 Claims, 12 Drawing Sheets

(56) References Cited

U.S. PATENT DOCUMENTS

| | | | |
|---|---|---|---|
| 6,907,595 B2 | 6/2005 | Curd et al. |
| 7,024,651 B1 | 4/2006 | Camilleri et al. |
| 7,057,413 B1 | 6/2006 | Young et al. |
| 7,109,750 B2 | 9/2006 | Vadi et al. |
| 7,124,338 B1 | 10/2006 | Mark et al. |
| 7,138,820 B2 | 11/2006 | Goetting et al. |
| 7,218,137 B2 | 5/2007 | Vadi et al. |
| 7,224,184 B1 | 5/2007 | Levi et al. |
| 7,233,532 B2 | 6/2007 | Vadi et al. |
| 7,235,999 B2 | 6/2007 | Goetting et al. |
| 7,302,625 B1 | 11/2007 | Payakapan et al. |
| 7,477,072 B1 | 1/2009 | Kao et al. |
| 7,478,357 B1 | 1/2009 | Mason et al. |
| 7,482,836 B2 | 1/2009 | Levi et al. |
| 7,509,617 B1 | 3/2009 | Young |
| 7,518,396 B1 | 4/2009 | Kondapalli et al. |
| 7,546,572 B1 | 6/2009 | Ballagh et al. |
| 7,599,299 B2 | 10/2009 | Goetting et al. |
| 7,619,442 B1 | 11/2009 | Mason et al. |
| 7,640,527 B1 | 12/2009 | Dorairaj et al. |
| 7,724,815 B1 | 5/2010 | Raha et al. |
| 7,746,099 B1 | 6/2010 | Chan et al. |
| 8,102,188 B1 | 1/2012 | Chan et al. |
| 8,359,448 B1 | 1/2013 | Neuendorffer |
| 8,415,974 B1 | 4/2013 | Lysaght |
| 8,719,750 B1 | 5/2014 | Balzli, Jr. |
| 8,928,351 B1 | 1/2015 | Konduru |
| 9,201,999 B1 * | 12/2015 | Sahni | G06F 30/398 |
| 9,722,613 B1 | 8/2017 | Schultz et al. |
| 10,296,699 B1 | 5/2019 | Yu et al. |
| 10,558,777 B1 * | 2/2020 | Yu | G06F 30/394 |
| 10,608,641 B2 | 3/2020 | Yu et al. |
| 10,621,299 B1 | 4/2020 | Yu et al. |
| 10,651,853 B1 | 5/2020 | Kong et al. |

* cited by examiner

1100

Implement first circuitry within a static region of programmable circuitry of a programmable integrated circuit, wherein the first circuitry implements a static isolation module of a circuit design
1102

Implement second circuitry within a partial reconfiguration region of the programmable circuitry, wherein the second circuitry corresponds to a first reconfigurable module instance of the circuit design that connects to the static isolation module
1104

Subsequent to implementing the second circuitry, implement third circuitry within the partial reconfiguration region of the programmable circuitry by replacing the second circuitry with the third circuitry while the first circuitry continues to operate, wherein the third circuitry corresponds to a second reconfigurable module instance of the circuit design that connects to the static isolation module, and wherein the second circuitry includes a number of isolated modules that differs from a number of isolated modules of the third circuitry
1106

FIG. 11

DYNAMIC PORT HANDLING FOR ISOLATED MODULES AND DYNAMIC FUNCTION EXCHANGE

TECHNICAL FIELD

This disclosure relates to partial reconfiguration of programmable integrated circuits and, more particularly, to dynamic port handling for isolated modules and dynamic function exchange technology.

BACKGROUND

A programmable integrated circuit (IC) refers to an integrated circuit that includes programmable circuitry. Programmable logic is an example of programmable circuitry. The programmable circuitry may be used to build reconfigurable digital circuits. Programmable circuitry may be formed of many programmable circuit blocks that provide basic functionality. The topology of the programmable circuitry is highly configurable.

Partial reconfiguration, also referred to as "dynamic function exchange," is a technology in which a region of programmable circuitry of a programmable IC, referred to as a "partial reconfiguration region" or "PR region," may be dynamically reconfigured by loading partial configuration data (e.g., sometimes referred to as a partial configuration bitstream) into the programmable IC. The partial configuration data may correspond to the PR region and, as loaded into the programmable IC, implement circuitry in the PR region that may be different from the circuitry previously implemented in the PR region. The PR region may undergo modification through partial reconfiguration repeatedly to implement different digital circuitry in the PR region over time. Circuits implemented in programmable circuitry outside of the PR region may be referred to as "static circuitry" or "static regions." Static circuitry need not be modified while the PR region is reconfigured. As such, the static circuitry may continue to operate uninterrupted while the PR region is reconfigured to implement these different circuits over time.

SUMMARY

In one or more example implementations, a method can include, using computer hardware, inserting, within a static isolated module of a circuit design, static drivers configured to drive isolated modules of reconfigurable module (RM) instances for inclusion in a RM of the circuit design. For each RM instance of a plurality of RM instances corresponding to the RM, the method can include inserting one or more additional ports in the RM based on a number of isolated modules included in a current RM instance, creating one or more nets corresponding to the one or more additional ports, and performing place and route on the circuit design including the current RM instance, the one or more additional ports, and the one or more nets. The method can include, prior to the inserting and the performing place and route for a next RM instance of the plurality of RM instances inserted into the RM, removing the current RM instance from the RM, the one or more additional ports, and the one or more nets.

In one or more example implementations, a system includes one or more processors configured to initiate operations. The operations can include inserting, within a static isolated module of a circuit design, static drivers configured to drive isolated modules of RM instances for inclusion in a RM of the circuit design. For each RM instance of a plurality of RM instances corresponding to the RM, the operations can include inserting one or more additional ports in the RM based on a number of isolated modules included in a current RM instance, creating one or more nets corresponding to the one or more additional ports, and performing place and route on the circuit design including the current RM instance, the one or more additional ports, and the one or more nets. The operations can include, prior to the inserting and the performing place and route for a next RM instance of the plurality of RM instances inserted into the RM, removing the current RM instance from the RM, the one or more additional ports, and the one or more nets.

In one or more example implementations, a method of operating a programmable integrated circuit can include implementing first circuitry within a static region of programmable circuitry of a programmable integrated circuit. The first circuitry implements a static isolation module of a circuit design. The method can include implementing second circuitry within a partial reconfiguration (PR) region of the programmable circuitry. The second circuitry can correspond to a first RM instance of the circuit design that connects to the static isolation module. The method can include, subsequent to implementing the second circuitry, implementing third circuitry within the PR region of the programmable circuitry by replacing the second circuitry with the third circuitry while the first circuitry continues to operate. The third circuitry corresponds to a second RM instance of the circuit design that connects to the static isolation module. The second circuitry includes a number of isolated modules that differs from a number of isolated modules included in the third circuitry.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 11 illustrates an example method of operating a programmable IC at runtime to load different circuits in a partial reconfiguration region of the programmable IC where the different circuits include different numbers of isolation modules.

DETAILED DESCRIPTION

Figure 1:
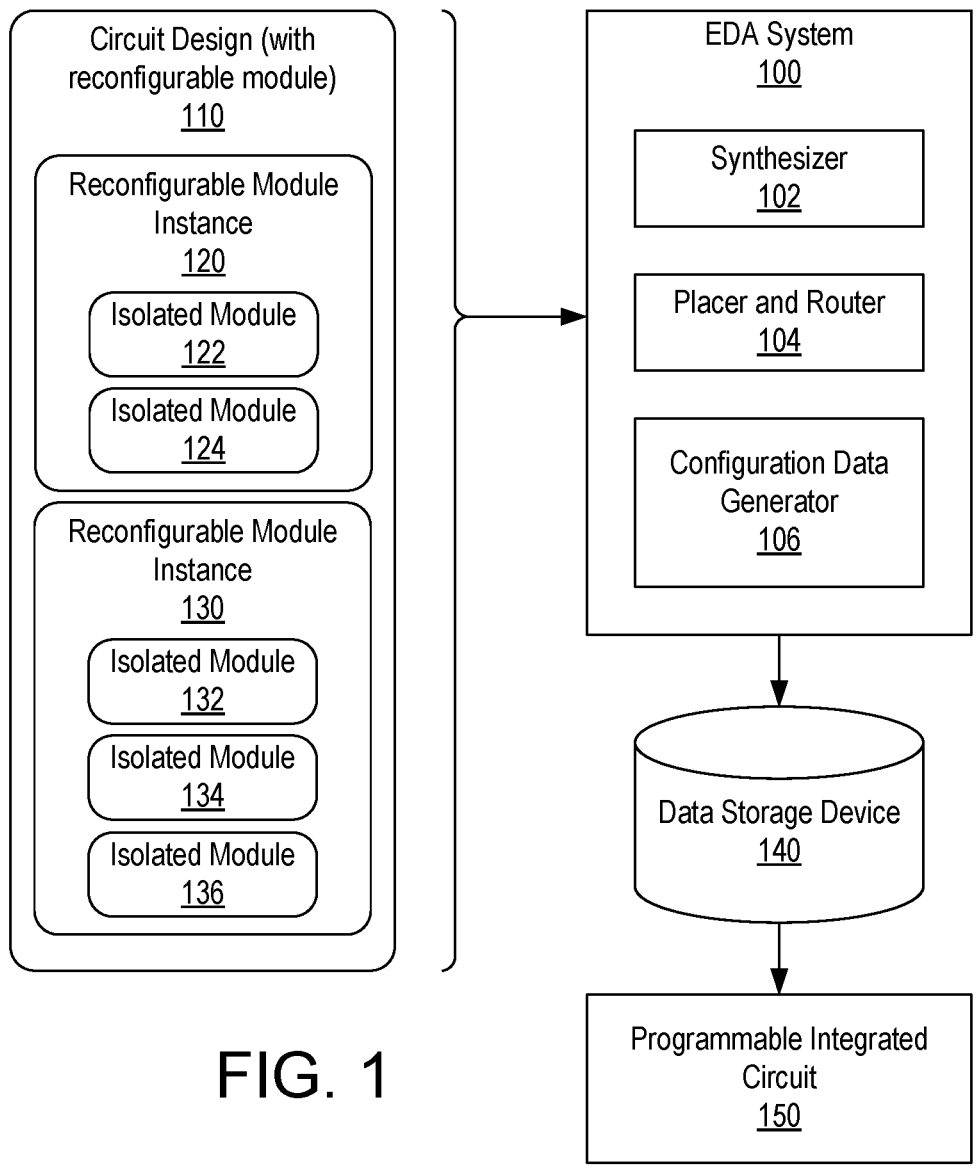
FIG. 1 illustrates certain operative features of an example Electronic Design Automation (EDA) system.

This disclosure relates to partial reconfiguration of programmable integrated circuits (ICs) and, more particularly, to dynamically handling ports of reconfigurable module (RM) instances with differing numbers of isolated modules. A circuit design intended to use partial reconfiguration technology will include one or more RMs. Each RM may correspond to a partial reconfiguration (PR) region of the programmable IC in which the circuit design is to be implemented. Each RM of the circuit design may receive one or more RM instances. Each RM instance corresponds to a different circuit that may be implemented in the PR region of the programmable IC at a particular or different time.

One aspect of partial reconfiguration is that different RM instances to be inserted in a RM are to have matching interfaces. That is, each RM instance for a same RM of a circuit design must have a set of ports that exactly match the set of ports of each other RM instance to be used with the RM. There may not be any interruption of nets at the boundary of the PR region on the programmable IC when implementing different digital circuits in the RM during development.

Another design technique referred to as isolated module design is intended to isolate modules of the same circuit design to prevent a failure of one isolated module from propagating to one or more other isolated modules of the circuit design. To achieve isolation, one requirement is that any fanout net that crosses more than two isolated modules on the programmable IC must be separated into different nets. This requires insertion of new driver circuits for the fanout net and port punching. Port punching refers to the creation or insertion of a port into a module.

While partial reconfiguration and isolated module design provide many technological advantages, these two technologies may have conflicting requirements. This is particularly true in cases where the RM instances to be used with a given RM have different numbers of isolated modules. In such cases, using isolated module design in combination with partial reconfiguration may result in one or more conditions that violate the requirements of one or both technologies, thereby preventing a circuit design that relies on both technologies from being realized in a programmable IC. A conventional Electronic Design Automation (EDA) tool, for example, in processing the circuit design through a design flow will error out and be unable to finish execution as the conflicting requirements of isolated module design and partial reconfiguration are not reconciled.

The inventive arrangements described within this disclosure address these conflicts to facilitate the use of isolated module design in combination with partial reconfiguration.

The inventive arrangements described within this disclosure provide implementation techniques and operations that address the conflicts that arise in meeting the requirements of both isolated module design and partial reconfiguration in cases where different numbers of isolated modules are used in the RM instances of a circuit design.

In one or more example implementations, matching interfaces may be achieved between RM instances having different numbers of isolated modules by using port punching during the development process. A port clean-up technique is disclosed for use during the development process that allows the punched ports corresponding to one RM instance to be cleaned up or removed prior to swapping a different RM instance into the RM for processing. This means that interfaces of different RM instances will match one another during the development process upon insertion into the RM thereby avoiding an interface mismatch type of conflict. In consequence, different RM instances with differing numbers of isolated modules may be used with a same RM over time. Further aspects of the inventive arrangements are described below with reference to the figures.

FIG. 1 illustrates certain operative features of an example EDA system 100. EDA system 100 is capable of processing a circuit design for implementation in a programmable IC where the circuit design includes one or more RMs. Further, the different RM instances to be implemented in the one or more RMs of the circuit design may include different numbers of isolated modules. More particularly, for a given RM of the circuit design, the RM instances to be implemented in the RM may have different numbers of isolated modules. EDA system 100 is capable of implementing such a circuit design, e.g., processing the circuit design through a design flow, while adhering to the requirement that the different RM instances have a same or identical interface.

In one or more example implementations, EDA system 100 is implemented in hardware (e.g., dedicated hardwired circuitry), software (e.g., program code executed by one or more processors), or a combination thereof. For example, EDA system 100 may be implemented as a data processing system, e.g., a computer, executing suitable program code. An example of a data processing system capable of implementing EDA system 100 is described in connection with FIG. 12 where EDA system 100 may be realized as program code electronically stored in a memory such as memory 1204 and executes on one or more processors such as processor 1202.

In the example of FIG. 1, EDA system 100 may include a synthesizer 102, a placer and router 104, and a configuration data generator 106. Synthesizer 102 is capable of performing synthesis on circuit design 110. Placer and router 104 is capable of performing placement and routing. Collectively, synthesizer 102 and placer and router 104 perform a design flow (e.g., synthesis, placement, and routing). In general, EDA system 100 is capable of receiving a circuit design 110 as input. Circuit design 110 may include a RM (not shown) and one or more RM instances 120, 130. The circuit design 110 may include more RMs and/or more RM instances than shown in the example of FIG. 1.

RM instances 120, 130 include different numbers of isolated modules. RM instance 120, for example, includes two isolated modules 122, 124, while RM instance 130 includes three isolated modules 132, 134, and 136. EDA system 100 is capable of processing circuit design 110 and RM instances 120, 130 through a design flow using synthesizer 102, placer and router 104, and configuration data generator 106 to generate configuration data that may be stored in data storage device 140. The configuration data may include one or more partial configuration bitstreams that implement circuitry in a static region of programmable IC 150 and circuitry specified by RM instances 120, 130 in a PR region of programmable IC 150. The PR region of programmable IC corresponds to the RM of circuit design 110.

In this example, circuitry specified by RM instances 120 and 130 are implemented in the PR region of programmable IC 150 at different times. That is, circuitry corresponding to RM instance 120 may be implemented in the PR region of programmable IC 150. Subsequently, circuitry corresponding to RM instance 130 may be implemented in the PR region of programmable IC 150. The circuitry in the PR region may be switched back and forth between that of RM instance 120 and RM instance 130. In switching circuitry of the RM instances 120, 130 over time, the circuitry implemented in the static region of programmable IC 150 may remain functional and continue to operate uninterrupted.

Figure 2:
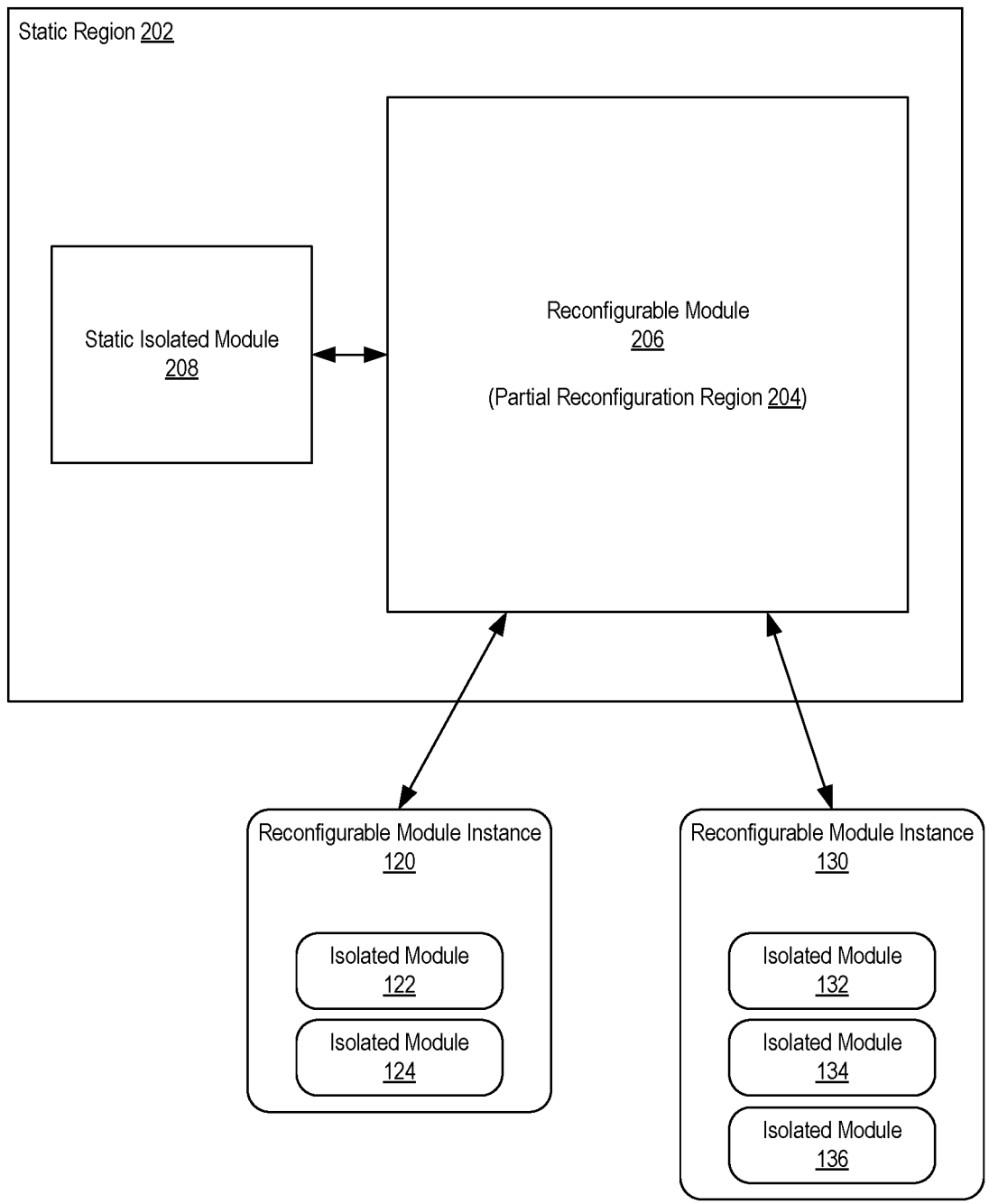
FIG. 2 illustrates an example floorplan for a programmable integrated circuit implementing a circuit design including a reconfigurable module.

FIG. 2 illustrates an example floorplan of programmable IC 150 in implementing circuit design 110. In the example, static region 202 of programmable IC 150 is illustrated along with PR region 204. Static region 202 and PR region 204 may be formed of programmable circuitry. Programmable circuitry may include programable logic. In some example implementations, static region 202 may also include one or more hardened circuit blocks.

As discussed, circuit design 110 includes a RM illustrated in FIG. 2 overlaid on programmable IC 150 as RM 206. In general, RM 206 is a logical construct of circuit design 110 that may receive different RM instances 120, 130 therein. During development of circuit design 110, RM instances 120, 130 may be included in RM 206 and processed through a design flow by EDA system 100. As loaded into programmable IC 150 at runtime, circuitry corresponding to RM instances 120, 130 are implemented, e.g., one at a time sequentially (at least in this example), in PR region 204. PR region 204 refers to the physical region of programmable circuitry of programmable IC 150 that is reserved for implementing different RM instances associated with RM 206. That is, the circuitry specified by RM instances 120, 130 are physically realized in the programmable IC 150 in PR region 204, which corresponds to RM 206.

In the example, circuit design 110 also includes or specifies a static isolated module 208. Static isolated module 208 is implemented in static region 202. As defined within this disclosure, the term "static isolated module" means an isolated module that is implemented in the static region of programmable circuitry of a programmable IC. Static isolated module 208 is configured to communicate with RM instances 120 and 130 when circuitry corresponding to each respective RM instance is implemented in PR region 204.

Figure 3:
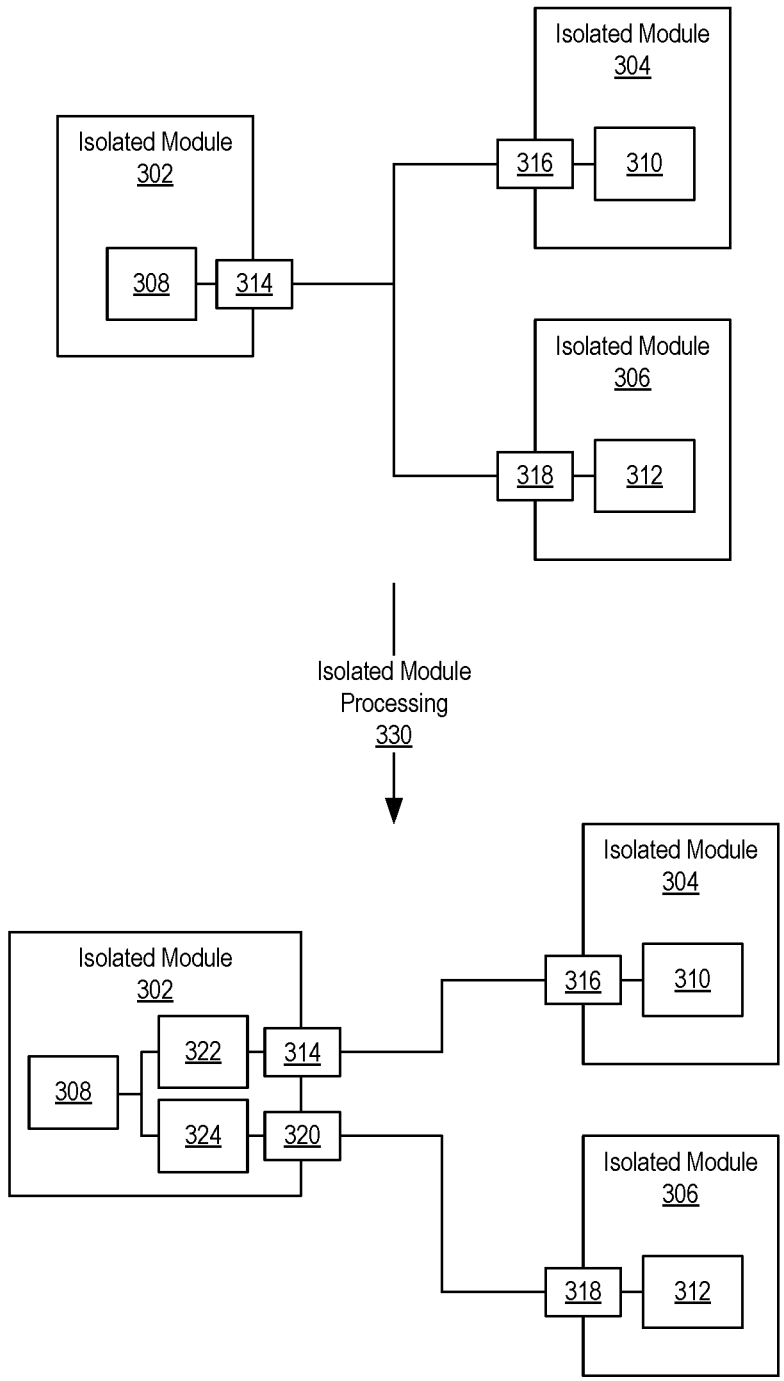
FIG. 3 illustrates an example of isolated module design.

FIG. 3 illustrates an example of isolated module design. The example circuit design of FIG. 3 includes isolated modules 302, 304, and 306. Isolated module 302 includes a driver 308 that drives loads 310 and 312 in isolated modules 304 and 306, respectively. In the example, isolated module 302 includes a port 314 that connects to port 316 of isolated module 304 and to port 318 of isolated module 306 via a single net. In order to achieve the desired isolation among isolated modules, an EDA system is capable of performing isolated module processing 330. As part of isolated module processing 330, the EDA system is capable of inserting an additional port 320 into isolated module 302 and adding drivers 322 and 324. Driver 308 couples to, e.g., drives, drivers 322, 324. For purposes of illustration, drivers 322 and 324 may be implemented as lookup-tables, though the drivers are not intended to be limited to the particular examples provided. The single net that previously joined isolated module 302 to isolated modules 304 and 306 is now split into two separate nets. Isolated module 304 is driven by driver 322 through port 314, while isolated module 306 is driven by driver 324 through port 320. Each isolated module having a load is driven by an independent driver and load from isolated module 302.

The example of FIG. 3 illustrates how to implement isolated modules. For purposes of illustration, consider the case where isolated module 302 is implemented in static circuitry, while isolated modules 304, 306 are implemented in a PR region as a RM instance. The interface between the static region and the PR region is formed of two nets with ports 314, 320 on isolated module 302, port 316 on isolated module 304, and port 318 on isolated module 306. It can be seen that if a different RM instance is loaded into the programmable IC that has a different number of isolated modules (e.g., 1, 3, 4, etc.), then the interface between the static region and the PR region changes. Trying to process a circuit design having two or more RM instances for a RM, where the two or more RM instances have different numbers of isolated modules, through a design flow triggers an error condition with a conventional EDA system since each RM instance has a different interface with the static region.

Figure 4:
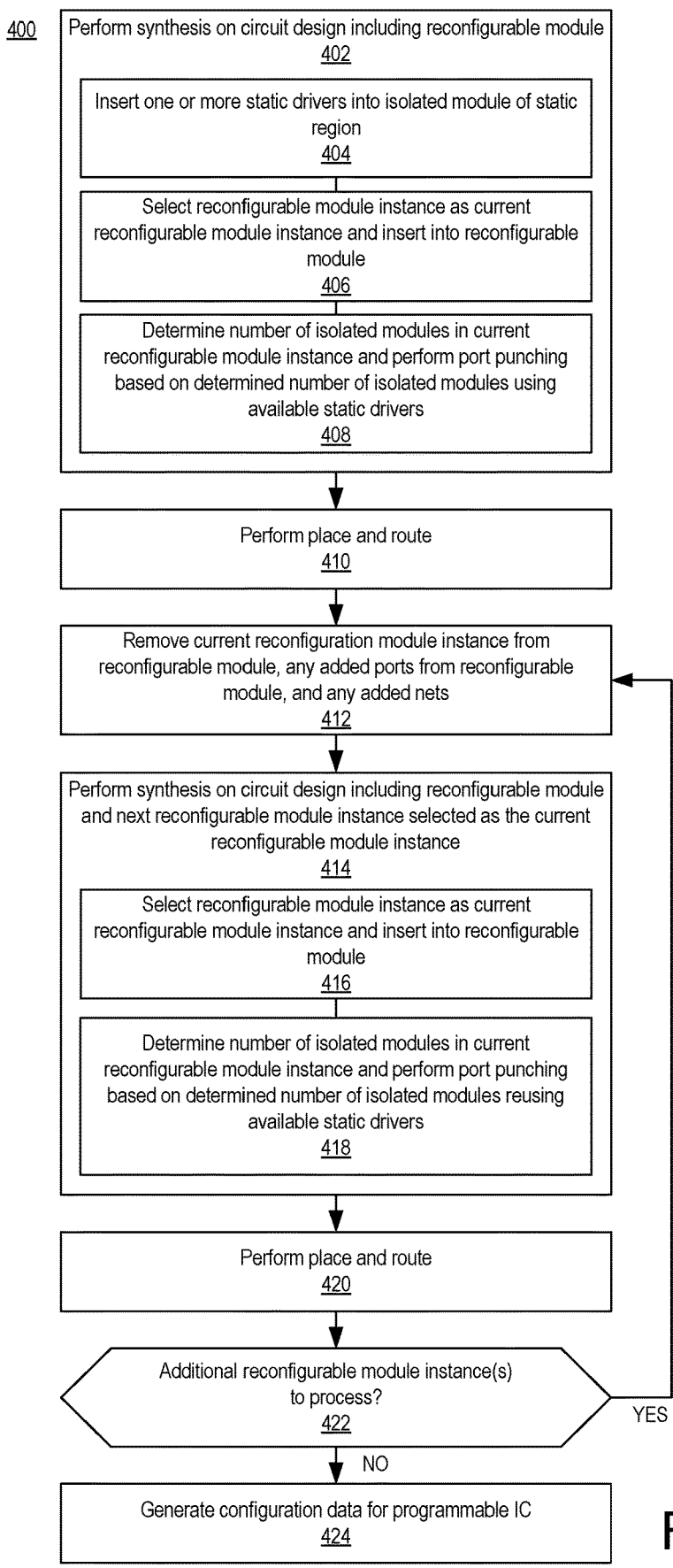
FIG. 4 illustrates an example method of implementing a circuit design using isolated modules and partial reconfiguration.

FIG. 4 illustrates an example method 400 of implementing a circuit design using isolated modules and partial reconfiguration. Method 400 may be performed by EDA system 100 as described in connection with the example of FIG. 1. Method 400 may begin in a state where a circuit design, e.g., circuit design 110, has been created and includes a RM. Further, there are at least two RM instances 120, 130 intended for implementation in the RM of circuit design 110, where each RM instance is designed to couple to, or connect, to a static isolated module 208 located in the static region 202 of the programmable IC 150. Further, at least two of the RMs 120, 130 include a different number of isolated modules.

In block 402, the EDA system 100, e.g., synthesizer 102, is capable of performing synthesis on circuit design 110. In block 404, the EDA system is capable of inserting one or more static drivers into the static isolated module 208. As discussed, the static isolated module of the static region is an isolated module that is specified by the circuit design, but is not included within a RM or designated as a RM. In an example, the particular number of static drivers inserted into the static isolated module of the static region is a user-specified parameter. In general, the number of static drivers inserted may be determined by the user as the maximum number of isolated modules of any of the RM instances to be included in the RM of the circuit design and that are to connect to the static isolated module.

Figure 5:
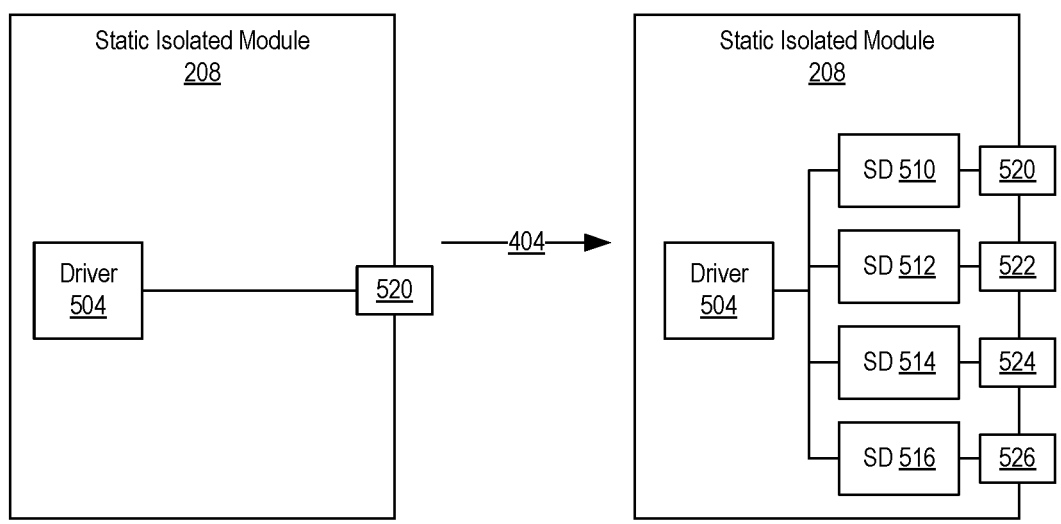
FIG. 5 illustrates an example of the operations performed in block 404 of FIG. 4.

Referring to the example of FIG. 5, static isolated module 208 is located in a static region of the programmable IC 150 and couples to a RM. Static isolated module 208 includes a driver 504 connected to a port 520. In performing block 404, the EDA system 100 inserts static drivers 510, 512, 514, and 516 to static isolated module 208. For example, the user has indicated that the largest number of isolated modules of any RM instance to be connected to static isolated module 208 is 4. As such, the EDA system 100 creates 4 static drivers within static isolated module 208. Further, the EDA system 100 punches, or inserts, an additional 3 ports 522, 524, and 526 to isolated module 208. EDA system connects driver 504 to each static driver 510, 512, 514, and 516, and connects each static driver 510, 512, 514, and 516 to a respective port 520, 522, 524, and 526.

Figure 6A:
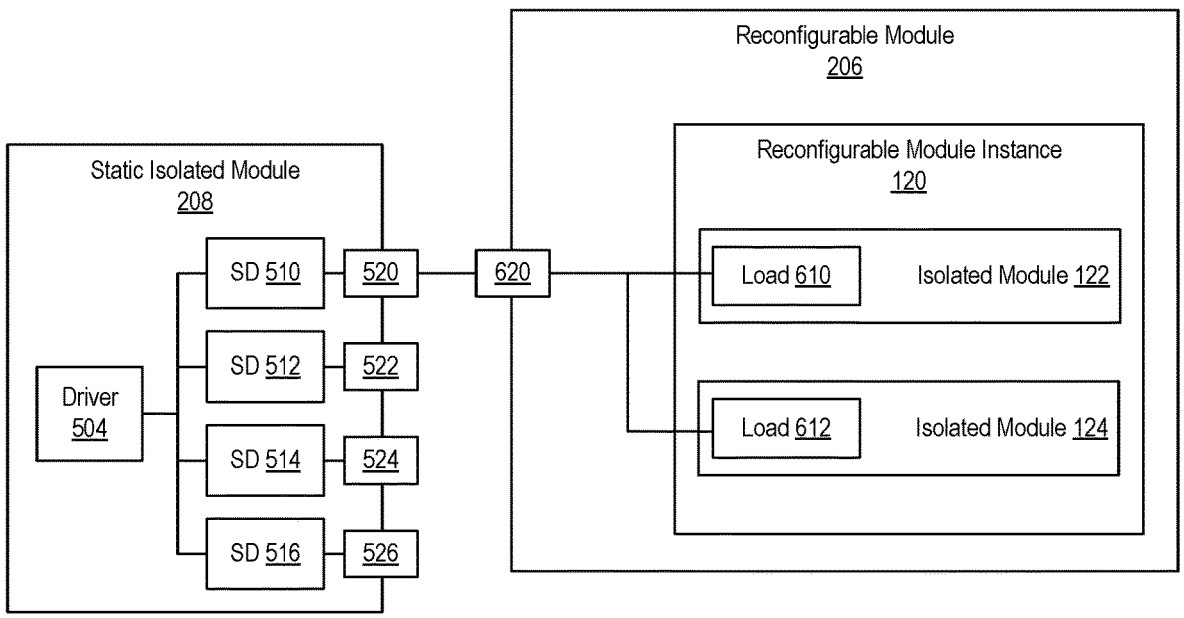
FIG. 6A illustrates an example of the operations performed in block 406 of FIG. 4.

In block 406, the EDA system 100, e.g., synthesizer 102, is capable of selecting a RM instance from a plurality of RM instances of the circuit design as the current RM instance. Further, the EDA system 100 is capable of inserting the current RM instance into the RM of the circuit design 110. FIG. 6A illustrates an example where the EDA system 100 selects RM instance 120 from the plurality of RM instances 120, 130 as the current RM instance. Further, the EDA system 100 has inserted RM instance 120 into RM 206. Isolated module 122 includes a load 610. Isolated module 124 includes a load 612. RM 206 includes a port 620 that is connected to port 520 of isolated module 208. Port 620 is coupled to load 610 and to load 612. Static driver 510 drives load 610 and load 612 via ports 520 and 620. As shown, both isolated modules 122 and 124 are driven by a same static driver 510, e.g., a single net, at least initially.

FIG. 6A is representative of the state of the interfaces between the static region and the PR region at the time that the RM instance is inserted into the RM. That is, to avoid an interface mismatch error between the static isolated module and the RM, each RM instance inserted into the RM for processing connects to the static isolated module by way of a single net to a single static driver though such net ultimately is to be isolated.

Figure 6B:
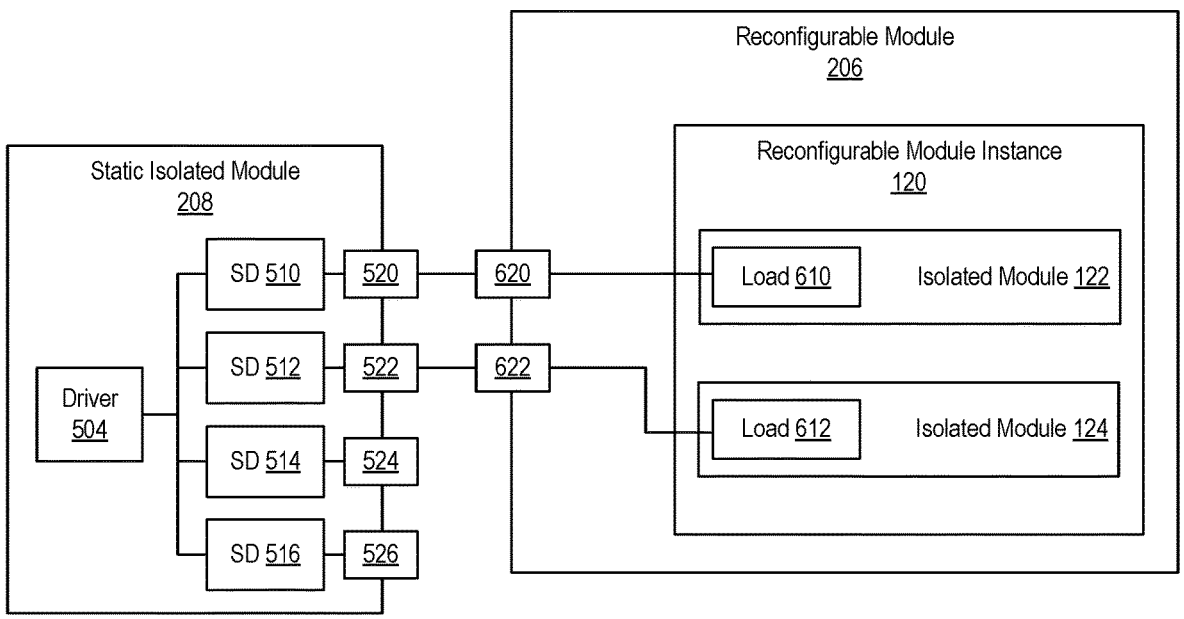
FIG. 6B illustrates an example of the operations performed in block 408 of FIG. 4.

In block 408, the EDA system 100, e.g., synthesizer 102, is capable of determining a number of isolated modules in the current RM instance and performing port punching based on the determined number of isolated modules. In the example of FIG. 6B, RM 206 includes the current RM instance 120. RM instance 120 includes isolated module 122 and isolated module 124.

Performing the operations described in connection with block 408, the EDA system 100 determines that the current RM instance 120 includes 2 isolated modules. In order to achieve isolation, an additional port is required for RM 206 to ensure that each isolated module 122, 124 communicates with static isolated module 208 via its own port and net. Accordingly, the EDA system 100 inserts an additional port 622 into RM 206. For purposes of illustration, if the number of isolated modules in an RM instance is "N," the EDA system 100 is capable of punching N-1 additional ports into the RM. Further, the EDA system 100 creates an additional net (e.g., N-1 additional nets) by coupling port 622 to port 522. In addition, the EDA system 100 disconnects load 612 from port 620 and connects load 612 to newly inserted port 622 so that each isolated module is driven by a different static driver.

In block 410, the EDA system 100, e.g., placer and router 104, is capable of performing place and route on circuit design 110. More particularly, the EDA system 100 is capable of placing and routing circuit design 110 in the state illustrated in FIG. 6B, where circuit design 110 includes static isolated module 208, RM instance 120, newly punched, or added, port 622, and the newly created net as such structures exist subsequent to the operations of block 408.

As part of performing place and route in block 410 and/or subsequently in block 420, the EDA system 100 is capable of storing the placed and routed circuit design or portion of the circuit design such as the RM instance and any connections (e.g., nets) between the RM instance and the static isolated module. The placement and routing information may be stored or persisted in memory for subsequent use.

Once the circuit design including the current RM instance is initially placed and routed, other operations are performed to process further RM instances with differing numbers of isolated modules without triggering error conditions. In the example of FIG. 6B, the interface between the static region (e.g., static isolated module 208) and RM 206 includes ports 520, 522, 620, and 622. Inserting another RM instance with a different number of isolated modules will necessarily have a different number of port connections thereby triggering an error condition indicating that the interface of the static isolated module does not match that of the RM.

Figure 7:
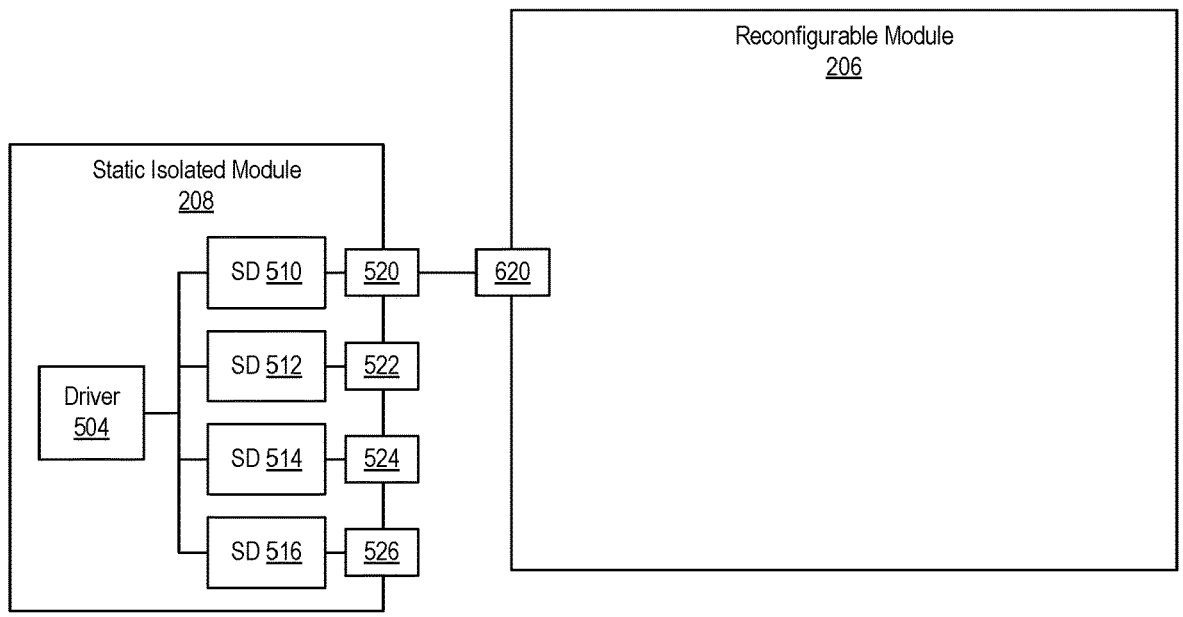
FIG. 7 illustrates an example of the operations performed in block 412 of FIG. 4.

Accordingly, in block 412, the EDA system 100 is capable of removing the current RM instance from the RM. The EDA system further removes any ports added to the RM and any nets added from block 408. For example, the EDA system 100 is capable of removing the contents of RM 206 along with any placement and routing data. As noted, the placement and routing data for the current RM instance 120 being removed may be stored in memory, e.g., persisted, for later use prior to removal. FIG. 7 illustrates an example state of the circuit design 110 subsequent to block 412 where RM instance 120 has been removed from RM 206. As shown, the contents of RM 206 are removed or deleted. Further, the EDA system 100 has removed port 622 and the net that connected port 622 to port 522. RM 206 is effectively empty. The original net connecting static driver 510 to port 620 remains.

In block 414, the EDA system 100 is capable of performing synthesis on the circuit design including a next RM instance selected as the current RM instance. In block 416, the EDA system 100 selects a next RM instance and inserts the selected RM instance into the RM of the circuit design for processing as the current RM instance.

Figure 8:
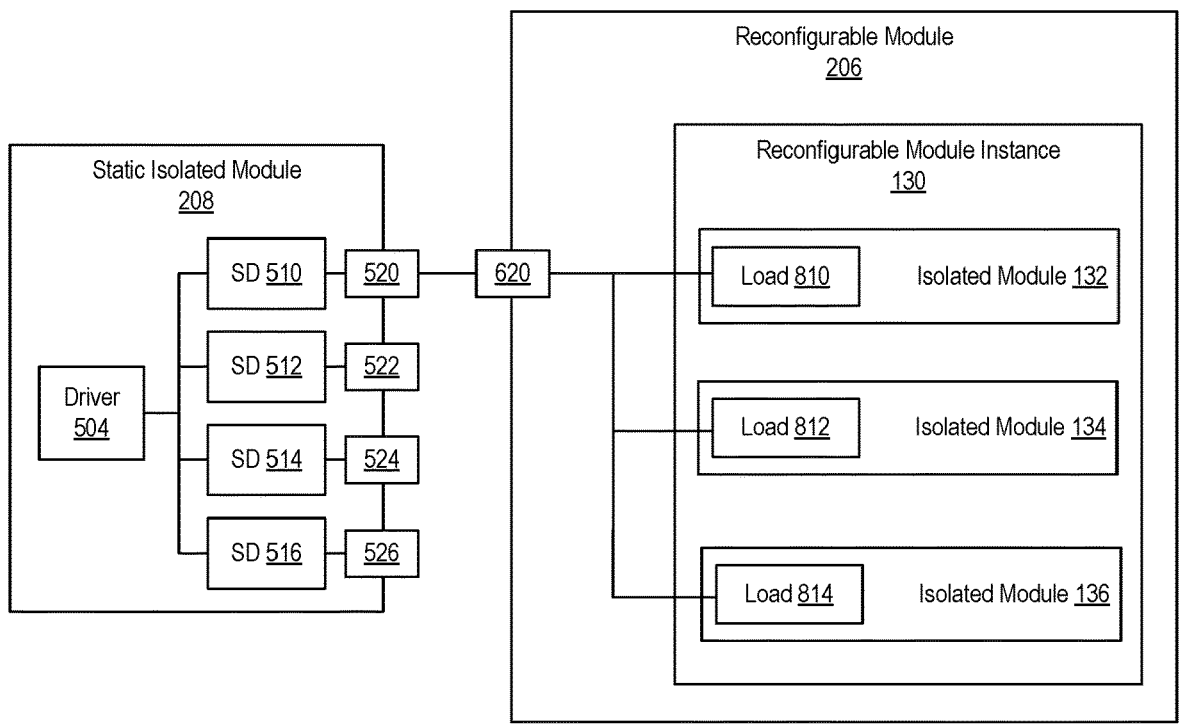
FIG. 8 illustrates an example of the operations performed in block 416 of FIG. 4.

In the example of FIG. 8, the EDA system 100 selects RM instance 130 as the current RM instance for performing block 416 and inserts RM instance 130 into RM 206. In the example, RM instance 130 includes isolated modules 132, 134, and 136. Isolated modules 132, 134, and 136 include loads 810, 812, and 814, respectively. The EDA system 100 connects each of loads 810, 812, 814 to port 620. Insertion of RM instance 130 in the manner shown in FIG. 8 utilizes the same interface as initially specified between the static isolated module 208 and RM 206 as illustrated in the example of FIG. 6A, thereby maintaining the same interfaces (e.g., number of ports) between the static isolated module 208 and the RM 206. This condition holds true at least with respect to the time at which each RM instance is inserted into the RM. Subsequent changes are permissible and do not trigger the interface mismatch error previously described. In the example of FIG. 8, however, the circuit architecture is not isolated. That is, each of isolated module instances 132, 134, and 136 is driven by static driver 510.

In block 418, the EDA system 100 is capable of determining the number of isolated modules in the current RM instance and performing port punching on the RM based on the determined number of isolated modules included in the current RM instance. In performing port punching, the EDA system 100 is capable of reusing available static drivers.

Figure 9:
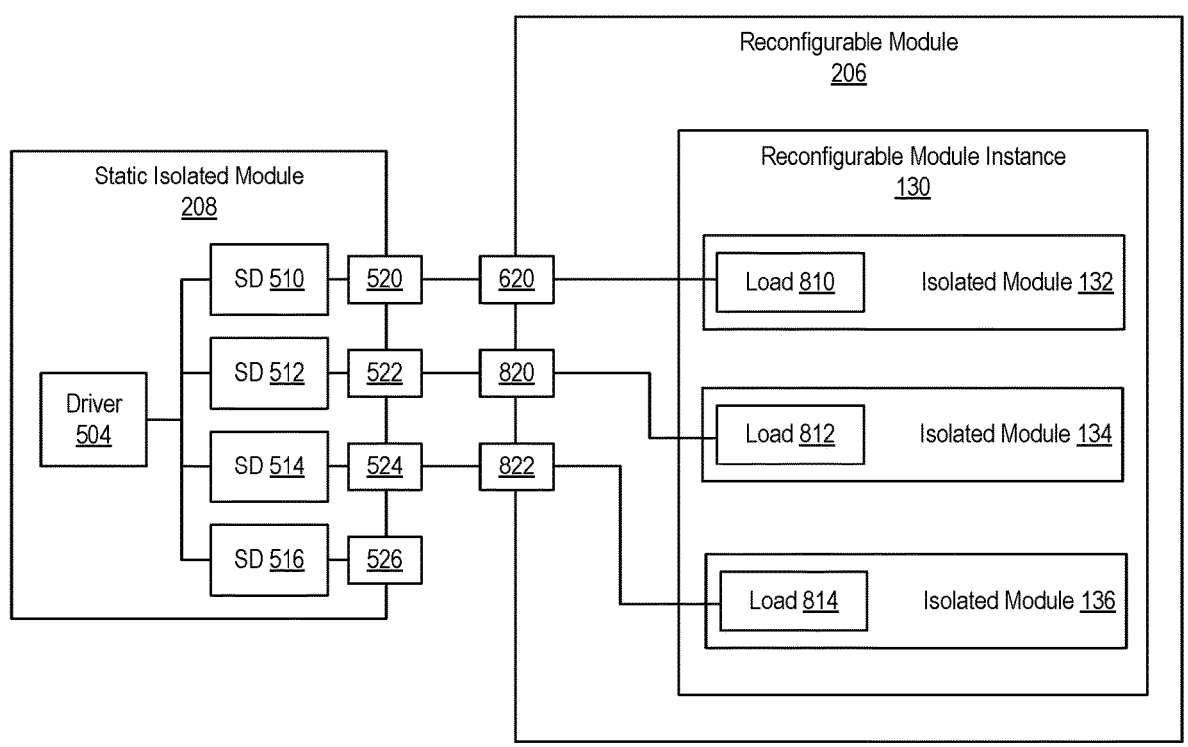
FIG. 9 illustrates an example of the operations performed in block 418 of FIG. 4.

In the example of FIG. 9, the EDA system 100 determines that RM instance 130 includes 3 isolated modules. Accordingly, EDA system 100 must include 2 additional ports (e.g., N-2, where N=3) and create 2 additional nets to facilitate isolation when implementing RM instance 130. As pictured in the example of FIG. 9, the EDA system 100 inserts ports 820 and 822. Further, the EDA system 100 creates two additional nets with the first net coupling port 522 to port 820 and the second net coupling port 524 to port 822. The EDA system 100 connects port 822 to load 812 and connects port 822 to load 814. Port 620 remains coupled to load 810. Thus, each isolated module 132, 134, and 136 from the PR region is drive by a different static driver and connected to static isolated module 208 by a different net thereby maintaining isolation. In performing port punching, the static drivers 510, 512, and 514 are reused from one RM instance to another as may be required so long as the number of isolation modules does not exceed the available number of static drivers initially inserted into isolated module 208.

In block 420, the EDA system 100, e.g., placer and router 104, is capable of performing place and route on circuit design 110. More particularly, the EDA system 100 is capable of placing and routing circuit design 110 in the state as illustrated in FIG. 9 including static isolated module 208, RM instance 130, and newly punched, or added, ports 820, 822, and the newly created nets.

In block 422, the EDA system 100 determines whether there are any additional RM instance(s) of the circuit design to process. In response to determining that there are one or more RM instances to process, method 400 loops back to block 412 to continue processing. In response to determining that there are no further RM instances to process, method 400 continues to block 420.

In block 424, the EDA system 100 is capable of generating configuration data for the programmable IC. For example, the EDA system 100 is capable of generating configuration data specifying the circuitry to be implemented in the static region and configuration data specifying the circuitry that physically realizes each different RM instance. The configuration data specifying circuitry that physically realizes each different RM instance may include the nets that connect from the static isolated module to the RM instance. EDA system 100 is capable of generating configuration data from each of the saved placed and routed versions of the circuit design for the respective RM instances.

With the configuration data having been generated, the programmable IC 150 may be loaded with configuration data specifying the static circuitry and configuration data specifying first circuitry corresponding to a first of the RM instances. Subsequently, configuration data specifying second circuitry corresponding to a second of the RM instances may be loaded into the programmable IC 150. The circuitry corresponding to the second of the RM instances replaces the circuitry corresponding to the first of the RM instances within the PR region. In one aspect, a host data processing system that is separate from the programmable IC 150 and communicatively linked thereto may control the loading and/or unloading of configuration data with respect to programmable IC 150, e.g., control the partial reconfiguration process at runtime. In another aspect, a processor embedded within programmable IC 150 may control the loading and/or unloading of configuration data with respect to programmable IC 150, e.g., control the partial reconfiguration process at runtime.

Figure 10:
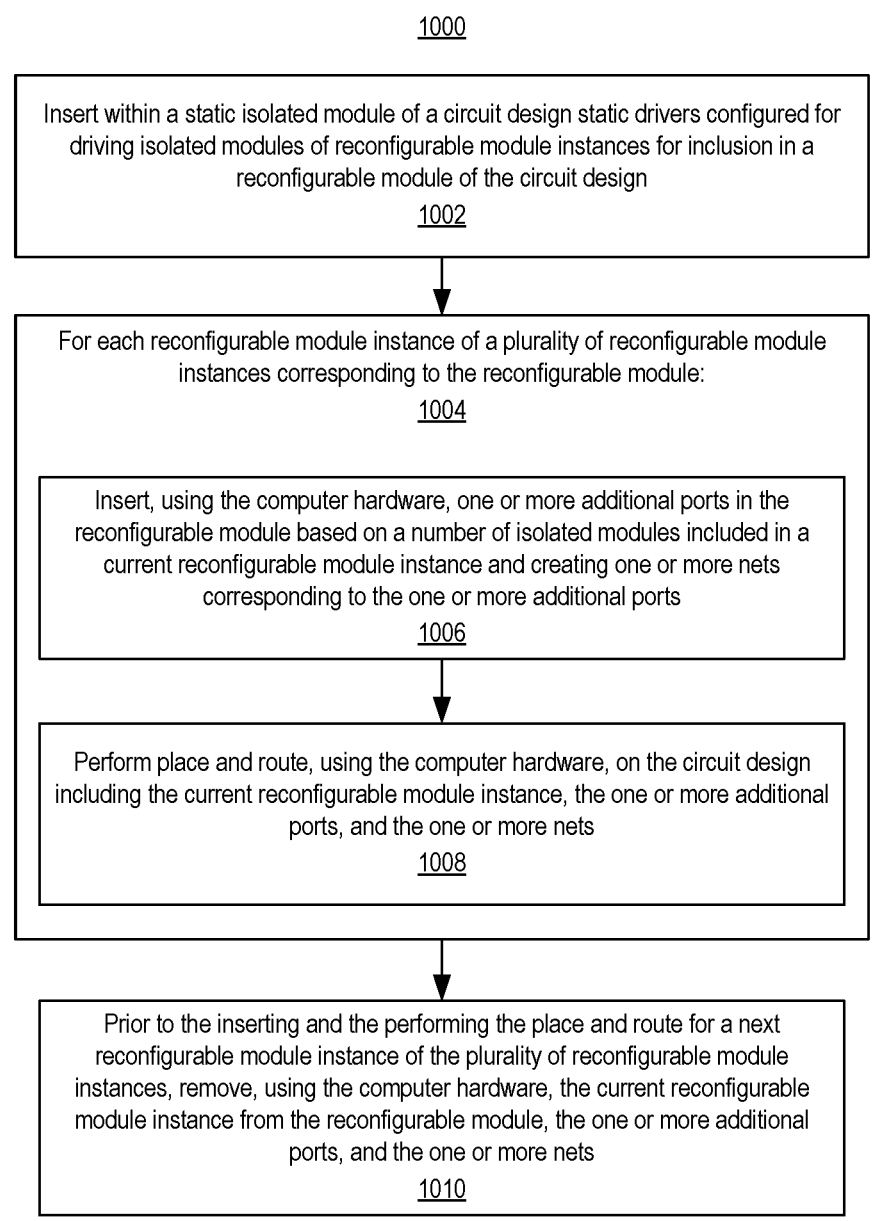
FIG. 10 illustrates another example method of implementing a circuit design using isolated modules and partial reconfiguration.

FIG. 10 illustrates another example method 1000 of implementing a circuit design using isolated modules and partial reconfiguration. Method 1000 may be performed by the EDA system 100 as described in connection with FIG. 1.

In block 1002, the EDA system 100 is capable of inserting within a static isolated module of a circuit design static drivers configured to drive isolated modules of RM instances for inclusion in a RM of the circuit design. For example, the EDA system 100 is capable of inserting static drivers 510, 512, 514, and 516 into static isolated module 208 as illustrated in FIG. 5.

In block 1004, for each RM instance of a plurality of RM instances to be inserted into the RM, the EDA system 100 is capable of performing different operations. In block 1006, the EDA system 100 is capable of inserting one or more additional ports in the RM based on a number of isolated modules included in a current RM instance and creating one or more nets corresponding to the one or more additional ports. It should be appreciated that the current RM instance is an RM instance that has been inserted into the RM. For example, the EDA system 100 is capable of inserting the additional port 622 in RM 206 as illustrated in FIG. 6B. Subsequent to inserting port 622, RM 206 includes a same number of ports as isolated modules contained in the current RM instance (e.g., RM instance 120). Further, EDA system 100 is capable of creating an additional net connecting port 522 to port 622 as illustrated in FIG. 6B. In block 1008, the EDA system 100 is capable of performing place and route on the circuit design including the current RM instance, the one or more additional ports, and the one or more nets.

In block 1010, the EDA system 100 is capable of removing the current RM instance from the RM, the one or more additional ports, and the one or more nets prior to performing blocks 1006 and 1008 for a next RM instance of the plurality of RM instances (e.g., prior to performing a further iteration of block 1004) inserted into the RM. The operations described in blocks 1006 and 1008 may be performed iteratively with block 1010 being performed after each execution of blocks 1006 and 1008.

The foregoing and other implementations can each optionally include one or more of the following features, alone or in combination. Some example implementations include all the following features in combination.

In one aspect, a number of the static drivers inserted is user-specified.

In another aspect, the number of static drivers is selected to be greater than or equal to a largest number of isolated modules included in any individual RM instance of the plurality of RM instances. For example, referring to the example of FIG. 1, the number of static drivers should be greater than or equal to 3 correspond to the three isolated modules of RM instance 130.

In another aspect, the number of isolated modules of each of the plurality of RM instances does not exceed the number of static drivers inserted into the static isolated module.

In another aspect, for each RM instance of the plurality of RM instances corresponding to the RM, the EDA system 100 is capable of determining the number of isolated modules included.

In another aspect, the EDA system 100 is capable of generating configuration data specifying circuitry for the static isolated module and each RM instance of the plurality of RM instances.

In another aspect, the inserting one or more additional ports in the RM based on the number of isolated modules included in the current RM instance and the creating the one or more nets corresponding to the one or more additional ports connects the static isolated module to the current RM instance by a number of nets that is equivalent to the number of isolated modules in the current RM instance.

In another aspect, the EDA system 100 is capable of inserting, within the static isolated module, one or more additional ports so that a number of ports of the static isolated module equals the number of static drivers. Each port of the static isolated module can be connected to one of the static drivers and each static driver is connected to an original driver of the static isolated module.

In another aspect, the performing place and route includes routing each net connecting the static isolated module with the RM. The number of nets connecting the static isolated module with the RM can vary for at least two of the plurality of RM instances.

FIG. 11 illustrates an example method 1100 of operating a programmable IC at runtime to load different circuits in a PR region of the programmable IC where the different circuits include different numbers of isolation modules. Method 1100 may be performed by a processor executing suitable operational software, whether the processor is implemented in a data processing system external to, and communicatively linked to, the programmable IC or embedded in the programmable IC itself.

In block 1102, first circuitry is implemented within a static region 202 of programmable circuitry of a programmable IC 150, wherein the first circuitry implements a static isolation module 208 of a circuit design 110. For example, the processor may initiate the loading of configuration data specifying the first circuitry into the programmable IC.

In block 1104, second circuitry is implemented within a PR region 204 of the programmable circuitry, wherein the second circuitry corresponds to a first RM instance 120 of the circuit design 110 that connects to the static isolation module 208. The processor may initiate the loading of configuration data specifying the second circuitry into the programmable IC. Blocks 1102 and 1104 may be performed sequentially or concurrently.

In block 1106, subsequent to implementing the second circuitry, third circuitry is implemented within the PR region of the programmable circuitry by replacing the second circuitry with the third circuitry while the first circuitry continues to operate. The first circuitry may operate uninterrupted throughout the implementation of the third circuitry. The third circuitry corresponds to a second RM instance 130 of the circuit design 110 that connects to the static isolation module 208. The second circuitry includes a number of isolated modules (122, 124) that differs from a number of isolated modules (132, 134, 136) included in the third circuitry. The processor may initiate the loading of configuration data specifying the third circuitry into the programmable IC. In one aspect, the processor may load clearing configuration data into the programmable IC 150 to remove the second circuitry prior to loading the configuration data specifying the third circuitry.

The foregoing and other implementations can each optionally include one or more of the following features, alone or in combination. Some example implementations include all the following features in combination.

In another aspect, the first circuitry includes static drivers and the second circuitry is driven by a different number of the static drivers than the third circuitry.

It should be appreciated that the number of isolated modules included in the different RM instances may differ from the examples provided. Further, it may be the case that the first RM instance includes more isolated modules than the second RM instance. The particular number, whether increasing or decreasing, from one RM instance to the next is not intended as a limitation of the inventive arrangements described herein.

Figure 12:
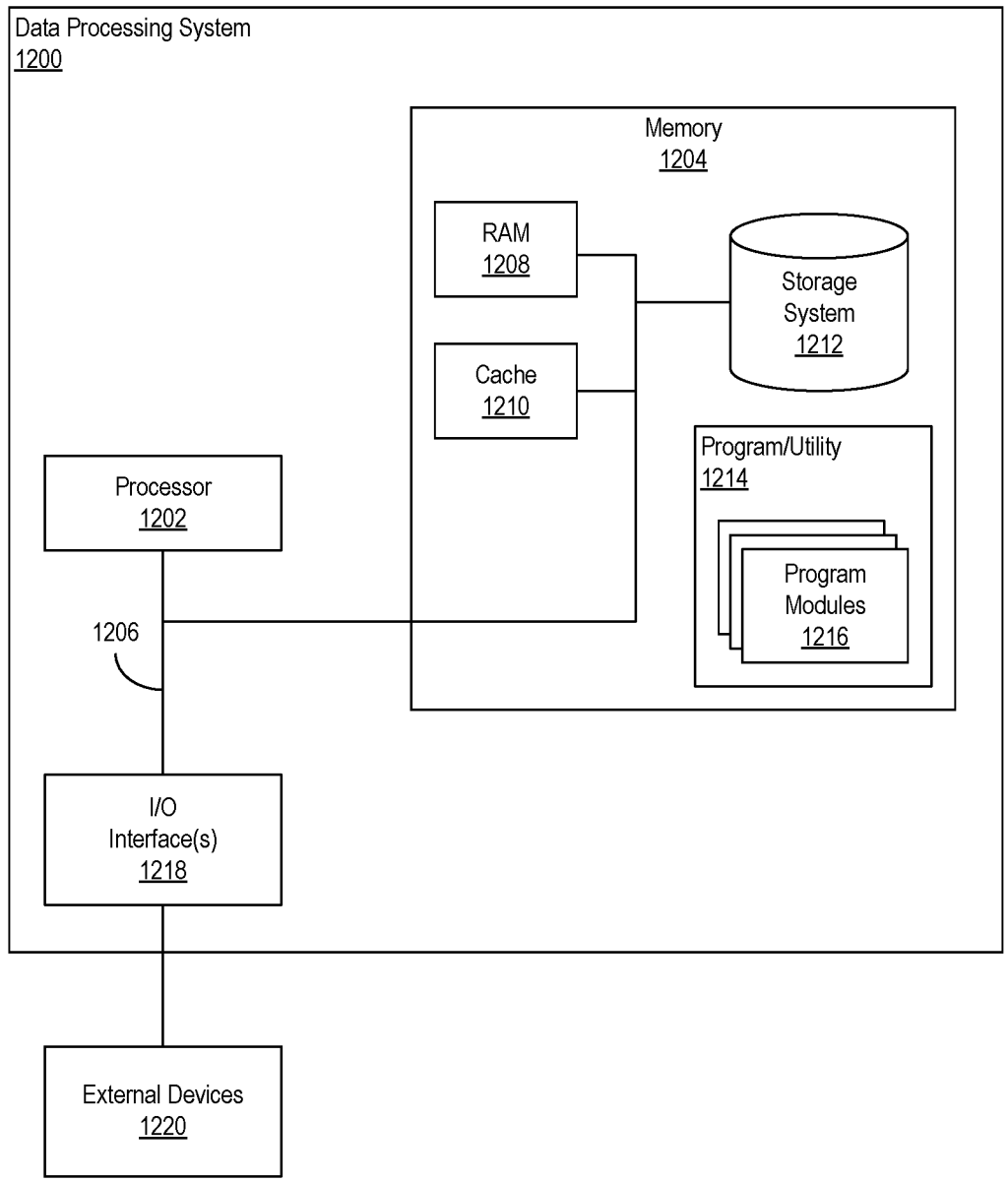
FIG. 12 illustrates an example of a data processing system for use with the inventive arrangements described herein.

FIG. 12 illustrates an example implementation of a data processing system 1200. As defined herein, "data processing system" means one or more hardware systems configured to process data, each hardware system including at least one processor programmed to initiate operations and memory.

The components of data processing system 1200 can include, but are not limited to, a processor 1202, a memory 1204, and a bus 1206 that couples various system components including memory 1204 to processor 1202. Processor 1202 may be implemented as one or more processors. In an example, processor 1202 is implemented as a central processing unit (CPU). Example processor types include, but are not limited to, processors having an x86 type of architecture (IA-32, IA-64, etc.), Power Architecture, ARM processors, and the like. Such processors may use complex or reduced instruction set computer architectures, vector processing architectures, or other known architectures. As defined herein, the term "processor" means at least one circuit capable of carrying out instructions contained in program code. The circuit may be an IC or embedded in an IC.

Bus 1206 represents one or more of any of a variety of communication bus structures. By way of example, and not limitation, bus 1206 may be implemented as a Peripheral Component Interconnect Express (PCIe) bus. Data processing system 1200 typically includes a variety of computer system readable media. Such media may include computer-readable volatile and non-volatile media and computer-readable removable and non-removable media.

Memory 1204 can include computer-readable media in the form of volatile memory, such as random-access memory (RAM) 1208 and/or cache memory 1210. Data processing system 1200 also can include other removable/non-removable, volatile/non-volatile computer storage media. By way of example, storage system 1212 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1206 by one or more data media interfaces. Memory 1204 is an example of at least one computer program product.

Program/utility 1214, having a set (at least one) of program modules 1216, may be stored in memory 1204. Program/utility 1214 is executable by processor 1202. By way of example, program modules 1216 may represent an operating system, one or more application programs, other program modules, and program data. Program modules 1216, upon execution, cause data processing system 1200, e.g., processor 1202, to carry out the functions and/or methodologies of the example implementations described within this disclosure. Program/utility 1214 and any data items used, generated, and/or operated upon by data processing system 1200 are functional data structures that impart functionality when employed by data processing system 1200. As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor. For example, one or more program modules 1216 may implement EDA system 100.

Data processing system 1200 may include one or more Input/Output (I/O) interfaces 1218 communicatively linked to bus 1206. I/O interface(s) 1218 allow data processing system 1200 to communicate with one or more external devices 1220 and/or communicate over one or more networks such as a local area network (LAN), a wide area network (WAN), and/or a public network (e.g., the Internet). Examples of I/O interfaces 1218 may include, but are not limited to, network cards, modems, network adapters, hardware controllers, etc. Examples of external devices also may include devices that allow a user to interact with data processing system 1200 (e.g., a display, a keyboard, and/or a pointing device) and/or other devices such as accelerator card.

Data processing system 1200 is only one example implementation. Data processing system 1200 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

The example of FIG. 12 is not intended to suggest any limitation as to the scope of use or functionality of example implementations described herein. Data processing system 1200 is an example of computer hardware that is capable of performing the various operations described within this disclosure. In this regard, data processing system 1200 may include fewer components than shown or additional components not illustrated in FIG. 12 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Data processing system 1200 may be operational with numerous other general-purpose or special-purpose computing system environments or configurations. Examples of computing systems, environments, and/or configurations that may be suitable for use with data processing system 1200 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Some computing environments, e.g., cloud computing environments and/or edge computing environments using data processing system 1200 or other suitable data processing system, generally support the FPGA-as-a-Service (FaaS) model. In the FaaS model, user functions are hardware accelerated as circuit designs implemented within programmable ICs operating under control of the (host) data processing system. Other examples of cloud computing models are described in the National Institute of Standards and Technology (NIST) and, more particularly, the Information Technology Laboratory of NIST.

Figure 13:
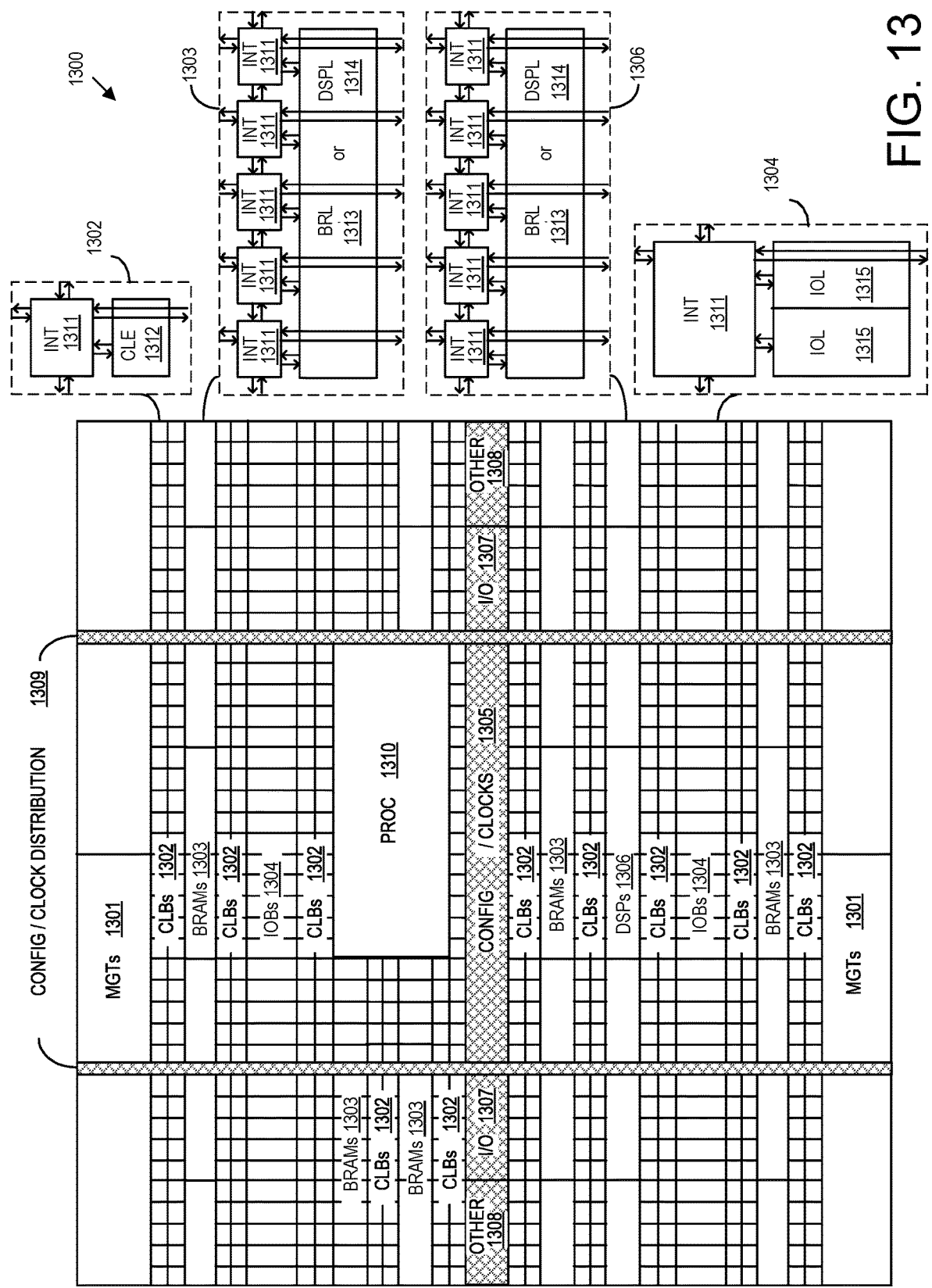
FIG. 13 illustrates an example architecture for an integrated circuit (IC).

FIG. 13 illustrates an example architecture 1300 for an IC. In one aspect, architecture 1300 may be implemented within a programmable IC. A programmable IC is an IC with at least some programmable circuitry. Programmable circuitry may include programmable logic. For example, architecture 1300 may be used to implement a field programmable gate array (FPGA). Architecture 1300 may also be representative of a system-on-chip (SoC) type of IC. An example of an SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1300 includes several different types of programmable circuit, e.g., logic, blocks. For example, architecture 1300 may include a large number of different programmable tiles including multi-gigabit transceivers (MGTs) 1301, configurable logic blocks (CLBs) 1302, random-access memory blocks (BRAMs) 1303, input/output blocks (IOBs) 1304, configuration and clocking logic (CONFIG/CLOCKS) 1305, digital signal processing blocks (DSPs) 1306, specialized I/O blocks 1307 (e.g., configuration ports and clock ports), and other programmable logic 1308 such as digital clock managers, analog-to-digital converters, system monitoring logic, and so forth.

In some ICs, each programmable tile includes a programmable interconnect element (INT) 1311 having standardized connections to and from a corresponding INT 1311 in each adjacent tile. Therefore, INTs 1311, taken together, implement the programmable interconnect structure for the illustrated IC. Each INT 1311 also includes the connections to and from the programmable logic element within the same tile, as shown by the examples included at the right of FIG. 13.

For example, a CLB 1302 may include a configurable logic element (CLE) 1312 that may be programmed to implement user logic plus a single INT 1311. A BRAM 1303 may include a BRAM logic element (BRL) 1313 in addition to one or more INTs 1311. Typically, the number of INTs 1311 included in a tile depends on the height of the tile. As pictured, a BRAM tile has the same height as five CLBs, but other numbers (e.g., four) also may be used. A DSP tile 1306 may include a DSP logic element (DSPL) 1314 in addition to an appropriate number of INTs 1311. An 10B 1304 may include, for example, two instances of an I/O logic element (IOL) 1315 in addition to one instance of an INT 1311. The actual I/O pads connected to IOL 1315 may not be confined to the area of IOL 1315.

In the example pictured in FIG. 13, the shaded area near the center of the die, e.g., formed of regions 1305, 1307, and 1308, may be used for configuration, clock, and other control logic. Shaded areas 1309 may be used to distribute the clocks and configuration signals across the breadth of the programmable IC.

Some ICs utilizing the architecture illustrated in FIG. 13 include additional logic blocks that disrupt the regular columnar structure making up a large part of the IC. The additional logic blocks may be programmable blocks and/or dedicated circuitry. For example, a processor block depicted as PROC 1310 spans several columns of CLBs and BRAMs.

In one aspect, PROC 1310 may be implemented as dedicated circuitry, e.g., as a hardwired processor, that is fabricated as part of the die that implements the programmable circuitry of the IC. PROC 1310 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1310 may be omitted from architecture 1300 and replaced with one or more of the other varieties of the programmable blocks described. Further, such blocks may be utilized to form a "soft processor" in that the various blocks of programmable circuitry may be used to form a processor that can execute program code as is the case with PROC 1310.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 13 that are external to PROC 1310 such as CLBs 1302 and BRAMs 1303 are considered programmable circuitry of the IC.

In general, the functionality of programmable circuitry is not established until configuration data is loaded into the IC. A set of configuration bits may be used to program programmable circuitry of an IC such as an FPGA. In some cases, configuration data may also be referred to as a "configuration bitstream." In general, programmable circuitry is not operational or functional without first loading configuration data into the IC. The configuration data effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of configuration data. Hardwired circuitry is generally considered to have dedicated circuit blocks and interconnects, for example, that are functional without first loading configuration data into the IC, e.g., PROC 1310.

In some instances, hardwired circuitry may have one or more operational modes that can be set or selected according to register settings or values stored in one or more memory elements within the IC. The operational modes may be set, for example, through the loading of configuration data into the IC. Despite this ability, hardwired circuitry is not considered programmable circuitry as the hardwired circuitry is operable and has a particular function when manufactured as part of the IC.

In the case of an SoC, the configuration data may specify the circuitry that is to be implemented within the programmable circuitry and the program code that is to be executed by PROC 1310 or a soft processor. In some cases, architecture 1300 includes a dedicated configuration processor that loads the configuration data to the appropriate configuration memory and/or processor memory. The dedicated configuration processor does not execute user-specified program code. In other cases, architecture 1300 may utilize PROC 1310 to receive the configuration data, load the configuration data into appropriate configuration memory, and/or extract program code for execution.

FIG. 13 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 13 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1310 within the IC are for purposes of illustration only and are not intended as limitations.

A system as described herein in connection with FIG. 1, for example, is capable of further processing a circuit design having undergone the processing described herein for implementation within an IC having an architecture the same as or similar to that of FIG. 13. The system, for example, is capable of synthesizing, placing, and routing the circuit design. The system may also generate configuration data that, when loaded into the IC, physically implements or realizes the circuit design within the IC.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "soft" in reference to a circuit means that the circuit is implemented in programmable logic or programmable circuitry. Thus, a "soft processor" means at least one circuit implemented in programmable circuitry that is capable of carrying out instructions contained in program code.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. A method, comprising:
   using computer hardware, within a static isolated module of a circuit design having an original driver, inserting a plurality of static drivers each configured to drive an isolated module;
   for each reconfigurable module instance of a plurality of reconfigurable module instances inserted into a reconfigurable module, wherein the reconfigurable module includes an initial port,
      inserting, using the computer hardware, one or more additional ports in the reconfigurable module based on a number of isolated modules included in a current reconfigurable module instance such that each isolated module of the current reconfigurable module instance has a dedicated port on the reconfigurable module driven by a different one of the plurality of static drivers;
      creating one or more nets corresponding to the one or more additional ports; and
      performing place and route, using the computer hardware, on the circuit design including the current reconfigurable module instance, the one or more additional ports, and the one or more nets; and
   prior to the inserting and the performing place and route for a next reconfigurable module instance of the plurality of reconfigurable module instances inserted into the reconfigurable module, removing, using the computer hardware, the current reconfigurable module instance from the reconfigurable module, the one or more additional ports, and the one or more nets;
   wherein the circuit design including at least one reconfigurable module instance as placed and routed is implemented in an integrated circuit.

2. The method of claim 1, wherein a number of the plurality of static drivers inserted is user-specified.

3. The method of claim 1, wherein a number of the plurality of static drivers is selected to be greater than or equal to a largest number of isolated modules included in any reconfigurable module instance of the plurality of reconfigurable module instances.

4. The method of claim 1, wherein the number of isolated modules of each of the plurality of reconfigurable module instances does not exceed a number of the plurality of static drivers inserted into the static isolated module.

5. The method of claim 1, comprising:
   for each reconfigurable module instance of the plurality of reconfigurable module instances corresponding to the reconfigurable module, determining the number of isolated modules included.

6. The method of claim 1, comprising:
   generating configuration data specifying circuitry for the static isolated module and each reconfigurable module instance of the plurality of reconfigurable module instances.

7. The method of claim 1, wherein the inserting one or more additional ports in the reconfigurable module based on the number of isolated modules included in the current reconfigurable module instance and the creating the one or more nets corresponding to the one or more additional ports connects the static isolated module to the current reconfigurable module instance by a number of nets that is equivalent to the number of isolated modules in the current reconfigurable module instance.

8. The method of claim 1, comprising:
   inserting, within the static isolated module, one or more additional ports so that a number of ports of the static isolated module equals a number of the plurality of static drivers;
   wherein each port of the static isolated module is connected to one of the plurality of static drivers and each static driver is connected to the original driver of the static isolated module.

9. The method of claim 1, wherein the performing place and route comprises:
   routing each net connecting the static isolated module with the reconfigurable module;
   wherein the number of nets connecting the static isolated module with the reconfigurable module varies for at least two of the plurality of reconfigurable module instances.

10. A system, comprising:
    one or more processors configured to initiate operations including:
       within a static isolated module of a circuit design having an original driver, inserting one or more additional static drivers resulting in a plurality of static drivers each configured to drive an isolated module;
       for each reconfigurable module instance of a plurality of reconfigurable module instances inserted into a reconfigurable module, wherein the reconfigurable module includes an initial port,
          inserting one or more additional ports in the reconfigurable module based on a number of isolated modules included in a current reconfigurable module instance, wherein each isolated module of the current reconfigurable module instance has a dedicated port on the reconfigurable module driven by a different one of the plurality of static drivers;
          creating one or more nets corresponding to the one or more additional ports; and performing place and route on the circuit design including the current reconfigurable module instance, the one or more additional ports, and the one or more nets; and prior to the inserting and the performing place and route for a next reconfigurable module instance of the plurality of reconfigurable module instances inserted into the reconfigurable module, removing the current reconfigurable module instance from the reconfigurable module, the one or more additional ports, and the one or more nets;

wherein the circuit design including at least one reconfigurable module instance as placed and routed is implemented in an integrated circuit.

11. The system of claim 10, wherein a number of the plurality of static drivers inserted is user-specified.

12. The system of claim 10, wherein a number of the plurality of static drivers is selected to be greater than or equal to a largest number of the isolated modules included in any reconfigurable module instance of the plurality of reconfigurable module instances.

13. The system of claim 10, wherein the number of isolated modules of each of the plurality of reconfigurable module instances does not exceed a number of the plurality of static drivers inserted into the static isolated module.

14. The system of claim 10, wherein the one or more processors are configured to initiate operations comprising:
for each reconfigurable module instance of the plurality of reconfigurable module instances corresponding to the reconfigurable module, determining the number of isolated modules included.

15. The system of claim 10, wherein the one or more processors are configured to initiate operations comprising:
generating configuration data specifying circuitry for the static isolated module and each reconfigurable module instance of the plurality of reconfigurable module instances.

16. The system of claim 10, wherein the inserting one or more additional ports in the reconfigurable module based on the number of the isolated modules included in the current reconfigurable module instance and the creating the one or more nets corresponding to the one or more additional ports connects the static isolated module to the current reconfigurable module instance by a number of nets that is equivalent to the number of isolated modules in the current reconfigurable module instance.

17. The system of claim 10, wherein the one or more processors are configured to initiate operations comprising:
inserting, within the static isolated module, one or more additional ports so that a number of ports of the static isolated module equals a number of the plurality of static drivers;
wherein each port of the static isolated module is connected to one of the plurality of static drivers and each static driver is connected to the original driver of the static isolated module.

18. The system of claim 10, wherein the performing place and route comprises:
routing each net connecting the static isolated module with the reconfigurable module;
wherein the number of nets connecting the static isolated module with the reconfigurable module varies for at least two of the plurality of reconfigurable module instances.

\* \* \* \* \*